United States Patent
Sato et al.

(10) Patent No.: US 9,546,801 B2
(45) Date of Patent: Jan. 17, 2017

(54) SOLAR-THERMAL CONVERSION MEMBER, SOLAR-THERMAL CONVERSION DEVICE, AND SOLAR THERMAL POWER GENERATION DEVICE COMPRISING A β-FESI2 PHASE MATERIAL

(71) Applicants: Akinori Sato, Toyota (JP); Yoshiki Okuhara, Nagoya (JP); Seiichi Suda, Nagoya (JP); Daisaku Yokoe, Nagoya (JP); Takeharu Kato, Nagoya (JP); Toru Sasatani, Kariya (JP)

(72) Inventors: Akinori Sato, Toyota (JP); Yoshiki Okuhara, Nagoya (JP); Seiichi Suda, Nagoya (JP); Daisaku Yokoe, Nagoya (JP); Takeharu Kato, Nagoya (JP); Toru Sasatani, Kariya (JP)

(73) Assignees: Toyota Jidosha Kabushiki Kaisha, Toyota-shi, Aichi-ken (JP); Japan Fine Ceramics Center, Nagoya-shi, Aichi (JP); Kabushiki Kaisha Toyota Jidoshokki, Kariya-shi, Aichi-ken (JP)

(*) Notice: Subject to any disclaimer, the term of this patent is extended or adjusted under 35 U.S.C. 154(b) by 280 days.

(21) Appl. No.: 14/357,777

(22) PCT Filed: Nov. 9, 2012

(86) PCT No.: PCT/IB2012/002289
§ 371 (c)(1),
(2) Date: May 13, 2014

(87) PCT Pub. No.: WO2013/072731
PCT Pub. Date: May 23, 2013

(65) Prior Publication Data
US 2014/0305123 A1    Oct. 16, 2014

(30) Foreign Application Priority Data
Nov. 14, 2011   (JP) .................. 2011-249013

(51) Int. Cl.
*F24J 2/48* (2006.01)
*F24J 2/46* (2006.01)
(Continued)

(52) U.S. Cl.
CPC .............. *F24J 2/48* (2013.01); *C23C 14/0682* (2013.01); *C23C 14/0688* (2013.01);
(Continued)

(58) Field of Classification Search
CPC ..... H02S 40/44; H01L 31/0525; F24J 2/4652; F24J 2/485; F24J 2/48; F24J 2/487; Y02B 10/20; Y02B 10/40–10/45; F03G 6/06–6/068
See application file for complete search history.

(56) References Cited

U.S. PATENT DOCUMENTS 6,076,932 A    6/2000  Uchida et al.
2004/0126594 A1*  7/2004  Rubbia ............. F24J 2/4652
                                                                428/446
(Continued)

FOREIGN PATENT DOCUMENTS

CN      1679175 A    10/2005
CN    101761461 A     6/2010
(Continued)

OTHER PUBLICATIONS

Yasuhiro Fukuzawa ; Teruhisa Ootsuka ; Naotaka Otogawa ; Hironori Abe ; Yasuhiko Nakayama ; Yunosuke Makita; Characterization of β-FeSi2 films as a novel solar cell semiconductor. Proc. SPIE 6197, Photonics for Solar Energy Systems, 61970N (May 12, 2006); doi:10.1117/12.663892.*
(Continued)

*Primary Examiner* — Thomas Denion
*Assistant Examiner* — Xiaoting Hu
(74) *Attorney, Agent, or Firm* — Finnegan, Henderson, Farabow, Garrett & Dunner, LLP

(57) ABSTRACT

A solar-thermal conversion member includes a β-FeSi$_2$ phase material. The solar-thermal conversion member exhibits a high absorptance for visible light at wavelengths
(Continued)

of several hundred nm and a low absorptance for infrared light at wavelengths of several thousand nm and, as a consequence, efficiently absorbs visible light at wavelengths of several hundred nm and converts the same into heat and exhibits little thermal radiation due to thermal emission at temperatures of several hundred ° C. The solar-thermal conversion member may therefore efficiently absorb sunlight, provide heat, and prevent thermal radiation due to thermal emission.

23 Claims, 15 Drawing Sheets

(51) Int. Cl.
*C23C 14/06* (2006.01)
*C23C 14/16* (2006.01)
*F03G 6/06* (2006.01)

(52) U.S. Cl.
CPC .......... *C23C 14/165* (2013.01); *F24J 2/4652* (2013.01); *F24J 2/485* (2013.01); *F24J 2/487* (2013.01); *F03G 6/06* (2013.01); *F24J 2002/4683* (2013.01); *F24J 2002/4685* (2013.01); *Y02E 10/46* (2013.01)

(56) References Cited

U.S. PATENT DOCUMENTS

| | | | |
|---|---|---|---|
| 2004/0206387 A1* | 10/2004 | Funakubo | C30B 23/02 136/236.1 |
| 2005/0186435 A1 | 8/2005 | Chu et al. | |
| 2008/0092946 A1* | 4/2008 | Munteanu | H01L 31/032 136/252 |
| 2009/0087370 A1* | 4/2009 | Mikulec | H01L 31/032 423/344 |
| 2009/0235983 A1* | 9/2009 | Girt | H01L 21/02488 136/258 |
| 2010/0313875 A1* | 12/2010 | Kennedy | F24J 2/055 126/652 |
| 2013/0192668 A1* | 8/2013 | Winston | F24J 2/055 136/255 |

FOREIGN PATENT DOCUMENTS

| | | |
|---|---|---|
| JP | 10-153704 | 6/1998 |
| JP | 2004-303868 | 10/2004 |
| JP | 2007-109795 | 4/2007 |
| WO | WO 02/103257 A1 | 12/2002 |

OTHER PUBLICATIONS

S.W. Kim, M.K. Cho, Y. Mishima, D.C. Choi, High temperature thermoelectric properties of p- and n-type β-FeSi2 with some dopants, Intermetallics, vol. 11, Issue 5, May 2003, pp. 399-405, ISSN 0966-9795.*

Xiong Xichenc, "Review on the Solar Cell Based on the β-FeSi$_2$ Thin Film", Journal of Xinyang Normal University, vol. 23, No. 4, pp. 632-634, Oct. 2010.

C. Kennedy, "Review of Mid- to High-Temperature Solar Selective Absorber Materials", NREL/TP-520-31267 (Jul. 2002).

"Research of Renewable Energy Devices & Environmentally Friendly Materials (β-FeSi$_2$)", Hashimoto-Myo Lab.

A. Heya et al., "Development of Semiconductor Material (β-FeSi$_2$ film) for Next Generation using IBSD Method," No. 52, pp. 9-12.

* cited by examiner

FeSi$_2$-SiO$_2$ COMPOSITE FILM

Mo-SiO$_2$ COMPOSITE FILM

F I G . 12A
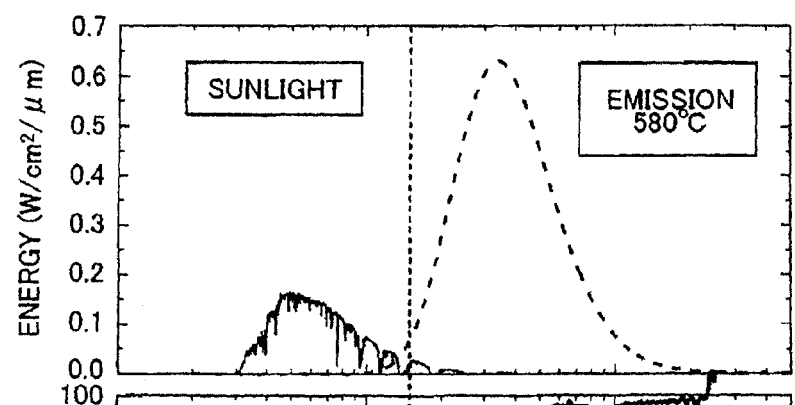
F I G . 12B
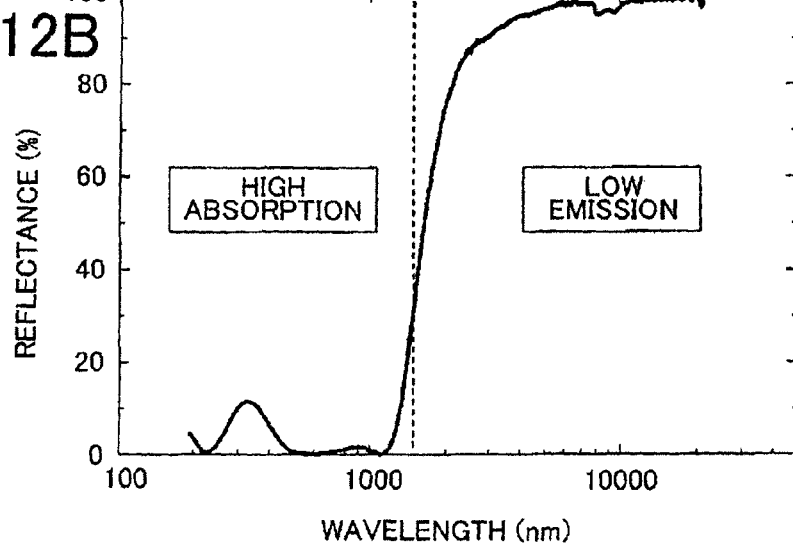

SOLAR-THERMAL CONVERSION MEMBER, SOLAR-THERMAL CONVERSION DEVICE, AND SOLAR THERMAL POWER GENERATION DEVICE COMPRISING A β-FESI2 PHASE MATERIAL

CROSS-REFERENCE TO RELATED APPLICATIONS

This application is a national phase application of International Application No. PCT/IB2012/002289, filed Nov. 9, 2012, and claims the priority of Japanese Application No. 2011-249013, filed Nov. 14, 2011, the content of both of which is incorporated herein by reference.

BACKGROUND OF THE INVENTION

1. Field of the Invention

The invention relates to a solar-thermal conversion member, a solar-thermal conversion device, and a solar thermal power generation device.

2. Description of Related Art

Conventional solar thermal power generation devices convert sunlight to heat and use this heat to generate power. In these devices, sunlight is concentrated at a collector and this concentrated sunlight is used to heat a thermal medium (oil, dissolved salt, molten sodium, and so forth) in a container or a flow channel.

Investigations have been carried out into coating the surface of the container or flow channel in order with this coating to promote the absorption of the concentrated sunlight and inhibit thermal radiation by thermal emission to the exterior from the container or flow channel (July, 2002, NREL/TP-520-31267, "Review of Mid- to High-Temperature Solar Selective Absorber Materials", C. E. Kennedy (referred to below as Kennedy)).

In connection with this, as shown in FIG. 1 the solar spectrum (thermal emission spectrum at a blackbody radiation temperature of approximately 5500° C.) extends centered on the visible light region at wavelengths of several hundred nm. On the other hand, the thermal emission spectrum at several hundred ° C. (for example, approximately 580° C.), which are temperatures readily obtained in solar-thermal conversion devices, extends centered on the infrared region at wavelengths of several thousand nm. Thus, the range of the thermal emission spectrum at the temperatures obtained in solar-thermal conversion devices is shifted from the range of the solar spectrum.

The emittance of thermal emission at a particular temperature corresponds to the absorptance for the light in the thermal emission spectrum corresponding to this temperature. Accordingly, low thermal radiation due to thermal emission at a temperature of several hundred ° C. means a small absorptance for the light in the thermal emission spectrum corresponding to a temperature of several hundred ° C., i.e., a small absorptance for infrared light at wavelengths of several thousand nm.

Thus, a coating that exhibits a high absorptance for sunlight and a low thermal radiation due to thermal emission at a temperature of several hundred ° C. can be said to be a coating that has a large absorptance for visible light at wavelengths of several hundred nm and a small absorptance for infrared light at wavelengths of several thousand nm. Such a coating can be advantageously used to promote the absorption of concentrated sunlight and to inhibit thermal radiation due to thermal emission to the outside from a container or flow channel.

Kennedy lists materials for such coatings and specifically gives W, $MoO_3$-doped Mo, B-doped Si, $CaF_2$, HfC, $ZrB_2$, $SnO_2$, $In_2O_3$, $Eu_2O_3$, $ReO_3$, $V_2O_5$, $LaB_6$, and so forth.

In addition to the selection of the material itself for such coatings, the layer structure of the coating is also conventionally optimized.

Coating layer structures are specifically described, for example, by Kennedy and in WO 02/103257. These documents also propose that interference due to reflection at the interfaces of a plurality of stacked layers having different refractive indices can be used to provide a coating that exhibits a high absorptance for visible light at wavelengths of several hundred nm and a low absorptance for infrared light at wavelengths of several thousand nm. Here, Kennedy describes the use, for example, of stacks of metal layers such as Mo, Ag, Cu, and Ni with dielectric layers such as $Al_2O_3$, $SiO_2$, $CeO_2$, and ZnS.

SUMMARY OF THE INVENTION

The invention provides a novel solar-thermal conversion member. The invention also provides a solar-thermal conversion device and a solar thermal power generation device that includes this solar-thermal conversion member.

The inventors discovered that a $\beta$-$FeSi_2$ phase material is suitable for a solar-thermal conversion member and achieved the invention described below as a result.

A first aspect of the invention relates to a solar-thermal conversion member that includes $\beta$-$FeSi_2$ phase material.

The proportion of this $\beta$-$FeSi_2$ phase material in the solar-thermal conversion member may be at least 95 vol %. The particles made of the $\beta$-$FeSi_2$ phase material may be dispersed in a matrix of an inorganic material. The solar-thermal conversion member may be a film. The film thickness may be 1 nm to 10 μm.

A second aspect of the invention relates to a solar-thermal conversion stack in which a first layer consisting of the aforementioned solar-thermal conversion member and a second layer consisting of an inorganic material are stacked. The second layer may include a ceramic layer consisting of an oxide, a nitride, a carbide, an oxynitride, an oxycarbide, or an oxycarbonitride. The outermost layer of the solar-thermal conversion stack may be this ceramic layer. This second layer may include a metal layer and this metal layer, the ceramic layer, and the first layer may be stacked in this sequence. The second layer may include a metal layer; the ceramic layer may include a first ceramic layer and a second ceramic layer; and this metal layer, the first ceramic layer, the first layer, and the second ceramic layer may be stacked in this sequence. The second ceramic layer may be the outermost layer. Here, the solar-thermal conversion stack may include a layer other than the metal layer, first ceramic layer, first layer, and second ceramic layer. For example, the solar-thermal conversion stack may contain, between the first layer and the second ceramic layer, a layer different from the first layer and containing a solar-thermal conversion member and a third ceramic layer containing an oxide, nitride, carbide, oxynitride, oxycarbide, or oxycarbonitride. The aforementioned metal layer may be stacked directly on a substrate or be stacked on a substrate with another layer interposed therebetween. The metal layer may be a molybdenum layer and the ceramic layer may be an $SiO_2$ layer.

A third aspect of the invention relates to a solar-thermal conversion device that has a first layer consisting of the above-described solar-thermal conversion member or the above-described solar-thermal conversion stack. The solar-thermal conversion device includes a collector; a thermal medium; and a container and/or allow channel for the thermal medium. Preferably the above-described first layer or solar-thermal conversion stack is disposed on the surface of the container and/or flow channel; the thermal medium is held within the container and/or the flow channel; light is concentrated on the container and/or the flow channel in the collector; and the thermal medium within the container and/or the flow channel is heated by the concentrated light.

The thermal medium may be heated to a temperature of 300° C. to 900° C. The solar-thermal conversion device may be a parabolic dish type, a solar tower type, a parabolic trough type, a Fresnel type, or a linear Fresnel type.

A fourth aspect of the invention relates to a solar thermal power generation device including the above-described solar-thermal conversion device and an electrical power generator. In this solar thermal power generation device, the thermal medium in the container and/or the flow channel is heated by the solar-thermal conversion device and electric power is generated by the electrical power generator using the thermal energy of the heated thermal medium.

A fifth aspect of the invention relates to a method of producing a solar-thermal conversion member in which the above-described β-FeSi$_2$ phase material is obtained by physical vapor deposition (PVD) at a substrate temperature of at least 300° C. An FeSi$_2$ phase material may be heated to a temperature of at least 300° C. to convert the FeSi$_2$ phase to the β-FeSi$_2$ phase.

A sixth aspect of the invention relates to the use of a β-FeSi$_2$ phase material as a solar-thermal conversion member.

The novel solar-thermal conversion member of the invention has a high absorptance for visible light at wavelengths of several hundred nm and also a low absorptance for infrared light at wavelengths of several thousand nm. As a consequence, visible light at wavelengths of several hundred nm is efficiently absorbed and converted to heat while there is little thermal radiation due to thermal emission at temperatures of several hundred ° C. Accordingly, the novel solar-thermal conversion member of the invention can produce heat by efficiently absorbing sunlight and can inhibit thermal radiation due to thermal emission.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 12A is a diagram that shows the relationship between the solar spectrum and the thermal emission spectrum at approximately 580° C., and FIG. 12B is a diagram that shows the reflectance spectrum of the stack obtained in Example 6;

Figure 1:
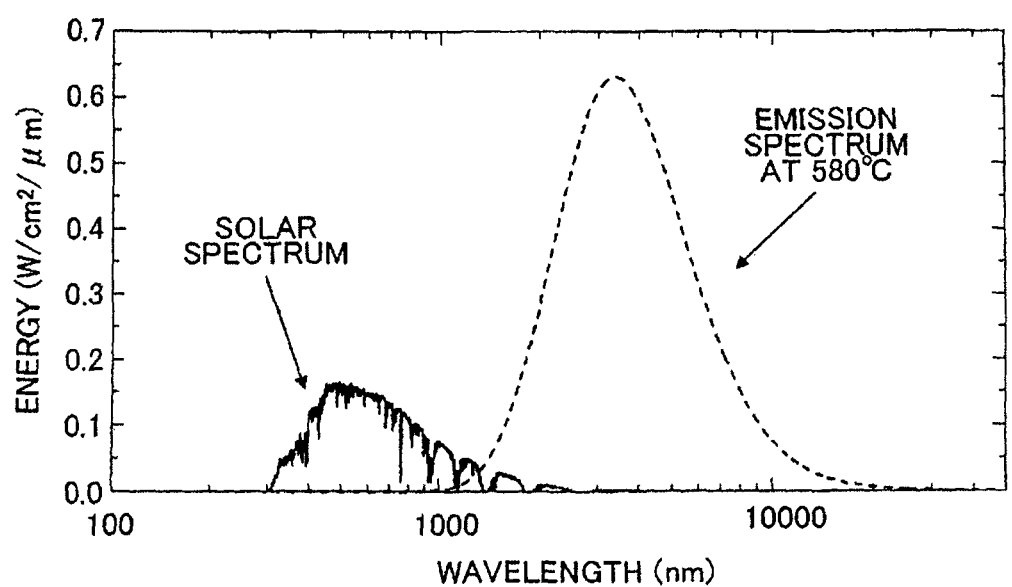
FIG. 1 is a diagram that shows the relationship between the solar spectrum (thermal emission spectrum at a blackbody radiation temperature of approximately 5500° C.) and the thermal emission spectrum at approximately 580° C., which is a temperature readily achieved in solar-thermal conversion devices.

DETAILED DESCRIPTION OF EMBODIMENTS (The Solar-Thermal Conversion Member)

The solar-thermal conversion member in an embodiment of the invention contains a β-FeSi$_2$ phase material.

The inventors determined that the optical characteristics of a β-FeSi$_2$ phase material included a large absorptance for visible light at wavelengths of several hundred nm and a small absorptance for infrared light at wavelengths of several thousand nm. Accordingly, the solar-thermal conversion member of this embodiment, which contains such a β-FeSi$_2$ phase material, can efficiently absorb sunlight and convert it to heat and can inhibit thermal radiation due to thermal emission.

The β-FeSi$_2$ phase material relating to this embodiment denotes a material in which at least a portion of the contained Fe and Si forms the β-FeSi$_2$ phase as well as a material substantially composed of the β-FeSi$_2$ phase. More particularly in relation to this embodiment, the β-FeSi$_2$ phase material denotes a material in which the contained Fe and Si form the β-FeSi$_2$ phase to the extent that the presence of the β-FeSi$_2$ phase is identified when analysis by X-ray diffraction analysis is carried out.

<The Solar-Thermal Conversion Member (Composition)>

The solar-thermal conversion member of this embodiment may contain the β-FeSi$_2$ phase material in any proportion and, for example, may contain the β-FeSi$_2$ phase material in a proportion of at least 10 vol %, at least 20 vol %, at least 30 vol %, at least 40 vol %, at least 50 vol %, at least 60 vol %, at least 70 vol %, at least 80 vol %, at least 90 vol %, or at least 95 vol %. In addition, this proportion may be, for example, less than 100 vol %, not more than 95 vol %, not more than 90 vol %, not more than 80 vol %, not more than 70 vol %, not more than 60 vol %, not more than 50 vol %, not more than 40 vol %, or not more than 30 vol %.

The solar-thermal conversion member of this embodiment may be composed substantially of only the β-FeSi$_2$ phase material. In addition, the β-FeSi$_2$ phase material may have a proportion of at least 80 vol %, at least 90 vol %, or at least 95 vol %.

The solar-thermal conversion member of this embodiment may also be a composite material of β-FeSi$_2$ phase material and another material.

Specifically, for example, the β-FeSi$_2$ phase material in the solar-thermal conversion member of this embodiment may be a particulate and particles of the β-FeSi$_2$ phase material may be dispersed in a matrix of an inorganic material In this case, reactions between the β-FeSi$_2$ phase material and other material can be prevented by the inorganic material serving as the matrix. Also in this case, the refractive index of the solar-thermal conversion member of this embodiment can be adjusted using the inorganic material serving as the matrix.

Any material that can disperse and retain the β-FeSi$_2$ phase material particles can be used as the inorganic material serving as the matrix, and in specific terms the oxides, nitrides, carbides, oxynitrides, oxycarbides, and oxycarbonitrides of metals and semimetals can be used, for example, silicon oxide (SiO$_2$).

<The Solar-Thermal Conversion Member (Form)>

In principle the solar-thermal conversion member of this embodiment can be used in any form, for example, in the form of a film, cylinder, or plate, and can be used in particular in film form.

When a film-form solar-thermal conversion member is used, its film thickness may be at least 1 nm, at least 5 nm, at least 10 nm, at least 20 nm, or at least 30 nm. In addition, this film thickness may be not more than 10 μm, not more than 5 μm, not more than 1 μm, or not more than 500 nm.

<The Solar-Thermal Conversion Member (Method of Production)>

The solar-thermal conversion member of this embodiment can be obtained by any method. The β-FeSi$_2$ phase material used for the solar-thermal conversion member of this embodiment is itself available. For example, it has been considered for use as a semiconductor material (Japanese Patent Application Publication No. 10-153704 (JP-10-153704 A)) and for the light-absorbing layer of the light-absorbing elements in optical devices such as optical disks, cameras, and laser printers (Japanese Patent Application Publication No. 2004-303868 (JP-2004-303868 A)). As a consequence, reference can be made to the art in these fields in regard to the production of the β-FeSi$_2$ phase material.

The β-FeSi$_2$ phase material in the solar-thermal conversion member of this embodiment can be obtained, for example, by physical vapor deposition (PVD), and particularly by sputtering, at a substrate temperature of at least 300° C., at least 400° C., or at least 500° C. Relatively higher substrate temperatures are preferred here for forming the β-FeSi$_2$ phase. In addition, the substrate temperature can be, for example, not more than 1000° C., not more than 900° C., not more than 800° C., or not more than 700° C.

The β-FeSi$_2$ phase material in the solar-thermal conversion member of this embodiment can also be obtained by a method that includes heating an FeSi$_2$ phase material, for example, an FeSi$_2$ phase material film deposited on a substrate, to a temperature of at least 300° C., at least 400° C., or at least 500° C. in order to convert the FeSi$_2$ phase to the β-FeSi$_2$ phase.

(The Solar-Thermal Conversion Stack)

The solar-thermal conversion stack of this embodiment has a single layer or a plurality of layers of the film-form solar-thermal conversion member of this embodiment stacked with a single layer or a plurality of layers of inorganic material.

When two or more layers of the solar-thermal conversion member of this embodiment are used, the properties of the solar-thermal conversion member layers, and particularly the optical properties such as the refractive index, can be adjusted by, for example, changing the proportion of the β-FeSi$_2$ phase material present in the solar-thermal conversion members or by changing the material that is present in the solar-thermal conversion members in combination with the β-FeSi$_2$ phase material.

With such a solar-thermal conversion stack of this embodiment, the absorptance for visible light at wavelengths of several hundred nm can be further increased by utilizing interference between the different layers that constitute the solar-thermal conversion stack. Specifically, the optical path difference for light reflected at the surface of two different layers can be made n+½-times (when the phase is shifted by ½ wavelength by reflection from each surface of both layers or when the phase is not shifted by reflection from each surface of both layers) the visible light wavelength (for example, 550 nm) or n-times (when the phase is shifted by ½ wavelength only by reflection from the surface of one layer) the visible light wavelength (for example, 550 nm) (n is 0 or a positive integer).

In this case, the occurrence of interference for infrared light can be avoided by having the optical path difference not be n+½-times or n-times the wavelength of the infrared light (wavelength of several thousand nm).

Reactions between the β-FeSi$_2$ phase material and other materials can be inhibited in the solar-thermal conversion stack of this embodiment by using a single layer or a plurality of layers of an inorganic material.

Inorganic materials that can be used for this single layer or plurality of layers of an inorganic material can be freely selected in conformity to the intended use, and in specific terms the oxide, nitride, carbide, oxynitride, oxycarbide, or oxycarbonitride of a metal or semimetal can be used.

Effects due to the optical properties, e.g., light reflection, absorption, and so forth, generated by a metal layer can be obtained—while preventing reactions between the metal layer and the β-FeSi$_2$ phase material—by stacking the metal layer; an oxide, nitride, carbide, oxynitride, oxycarbide, or oxycarbonitride layer; and a layer of the solar-thermal conversion member in the indicated sequence either directly on a substrate or with another layer interposed therebetween. The metal layer referenced here can be, for example, a molybdenum (Mo) layer, tungsten (W) layer, silver (Ag) layer, gold (Au) layer, or copper (Cu) layer and particularly a molybdenum (Mo) layer. A silicon dioxide (SiO$_2$) layer can be used for the oxide, nitride, carbide, oxynitride, oxycarbide, or oxycarbonitride layer. The substrate can be, for example, a steel such as a stainless steel (SUS). The another layer can be, for example, an oxide such as SiO$_2$ and Al$_2$O$_3$. An reaction between the steel and the metal layer is prevented by the another layer formed of the oxide. Therefore, performance reduction and corrosion degradation of the solar-thermal conversion stack are suppressed.

(The Solar-Thermal Conversion Device)

The solar-thermal conversion device of this embodiment has a solar-thermal conversion stack of this embodiment or a layer of the solar-thermal conversion member of this embodiment, a collector, a thermal medium, and a container and/or a flow channel for the thermal medium. The solar-thermal conversion member layer or solar-thermal conversion stack is coated on the surface of this container and/or flow channel; the thermal medium is held within the container and/or flow channel; sunlight is concentrated on the container and/or flow channel in the collector; and the thermal medium in the container and/or flow channel is heated by the concentrated sunlight.

The solar-thermal conversion member layer or the solar-thermal conversion stack of this embodiment can efficiently absorb sunlight and convert it to heat and can do so while inhibiting thermal radiation due to thermal emission from the heated container and/or flow channel. Accordingly, the solar-thermal conversion device of this embodiment can efficiently heat the thermal medium with sunlight.

The solar-thermal conversion device of this embodiment can be used to heat the thermal medium to at least 300° C., at least 400° C., or at least 500° C. The heating temperature for this thermal medium can be, for example, not more than 1100° C., not more than 1000° C., not more than 900° C., not more than 800° C., or not more than 700° C.

The collector used by the solar-thermal conversion device of this embodiment may be any type of collector and may be, for example, a parabolic dish type, solar tower type, parabolic trough type, Fresnel type, or linear Fresnel type.

The container and/or flow channel used by the solar-thermal conversion device of this embodiment may be any container and/or flow channel that can hold the thermal medium. For example, a pipe can be used for this flow channel and the thermal medium can flow through it.

(The Solar Thermal Power Generation Device)

The solar thermal power generation device of this embodiment has a solar-thermal conversion device of this embodiment and an electrical power generator; it heats the thermal medium in the container and/or flow channel using the solar-thermal conversion device and generates electrical power at the electrical power generator by utilizing the thermal energy of the heated thermal medium.

The solar-thermal conversion device of this embodiment can efficiently heat the thermal medium using sunlight. The solar thermal power generation device of this embodiment can efficiently generate electricity using solar heat.

Any mechanism can be used to generate electrical power with the electrical power generator of the solar thermal power generation device of this embodiment. Accordingly, for example, power can be generated by evaporating an evaporative medium such as water or ammonia with the heated thermal medium and using this vapor to turn the ammonia/steam turbine of an electrical power generator.

In Examples 1 to 4, a β-FeSi$_2$ single-phase film substantially composed of β-FeSi$_2$ phase material and a stack having this single-phase film were evaluated in comparison with an Mo single-phase film substantially composed of Mo and a stack having this single-phase film. In Examples 5 to 7, a β-FeSi$_2$—SiO$_2$ composite film containing a β-FeSi$_2$ phase material and SiO$_2$ and a stack containing this composite film were evaluated in comparison with an Mo—SiO$_2$ composite film containing Mo and SiO$_2$ and a stack containing this composite film.

Example 1

Determination of the Optical Properties of the Mo Film and FeSi$_2$ Film

An Mo film and FeSi$_2$ film were each formed by sputtering and the transmittance, reflectance, and absorptance spectra of these films were evaluated. Specifically, the Mo film and the FeSi$_2$ film were formed and the evaluations were carried out as follows.

(Formation of the Mo Film and FeSi$_2$ Film)

Quartz glass (length 30 mm×width 20 mm×thickness 1 mm) was used as the substrate, and the substrate temperature was set to 600° C. or room temperature (24° C.). The atmosphere during sputtering was an Ar atmosphere (flow rate=20 sccm, pressure=0.4 Pa). Mo metal and β-FeSi$_2$ were respectively used for the target. A plasma was generated at a sputtering power of 50 W using a direct-current (DC) power source. The film formation time was 30 minutes in both cases.

The obtained film thickness was approximately 160 nm for the Mo film and approximately 90 nm for the FeSi$_2$ film.

(Evaluations)

The transmittance, reflectance, and absorptance spectra of the Mo films and FeSi$_2$ films formed at substrate temperatures of 600° C. and room temperature (24° C.) were evaluated. The evaluation results for the Mo films are shown in FIGS. 2A and 2B and the evaluation results for the β-FeSi$_2$ films are shown in FIGS. 3A and 3B.

Figure 2A:
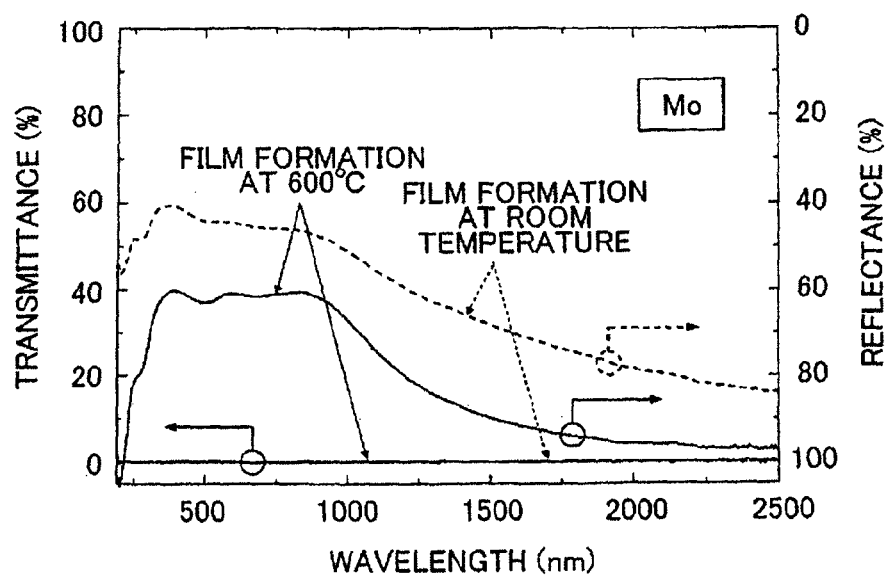
FIG. 2A is a diagram that shows the transmittance and reflectance spectra of Mo films produced at substrate temperatures of 600° C. and room temperature (24° C.)
Figure 2B:
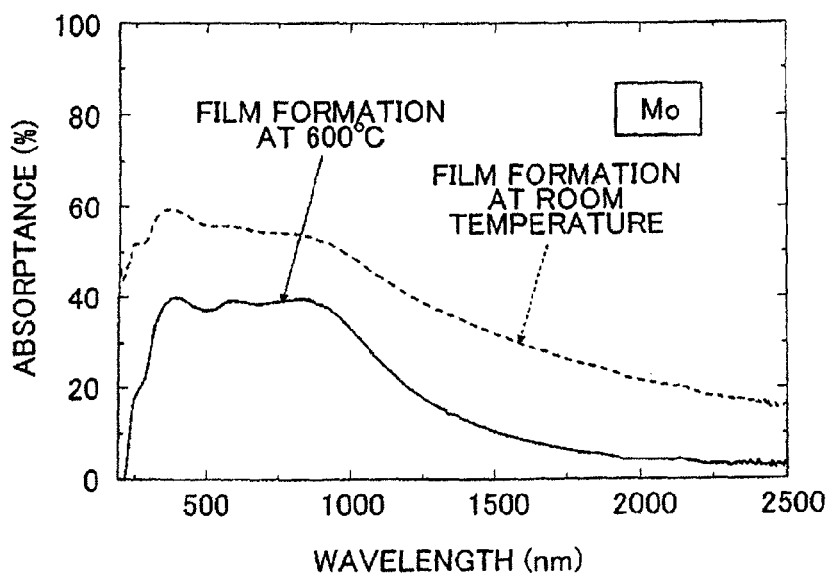
FIG. 2B is a diagram that shows the absorptance spectra of Mo films produced in Example 1 at substrate temperatures of 600° C. and room temperature (24° C.)
Figure 3A:
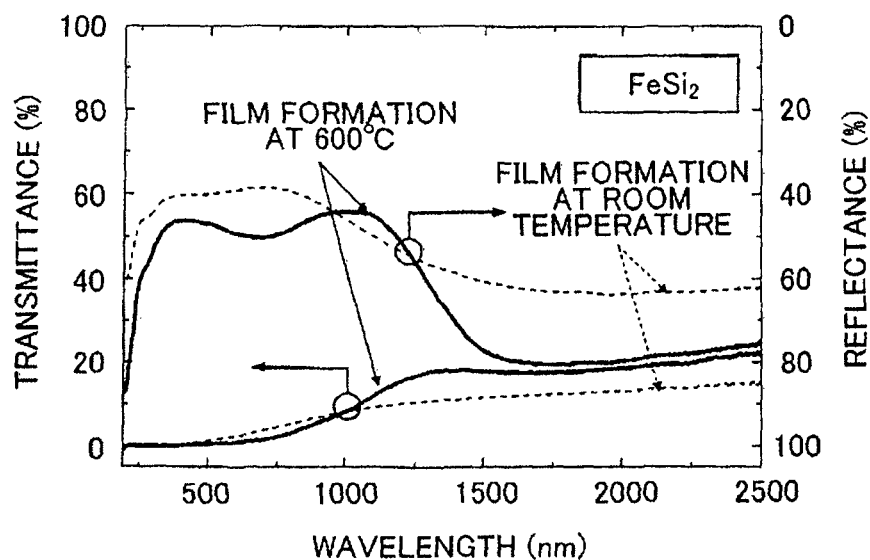
FIG. 3A is a diagram that shows the transmittance and reflectance spectra of FeSi$_2$ films produced in Example 1 at substrate temperatures of 600° C. and room temperature (24° C.)
Figure 3B:
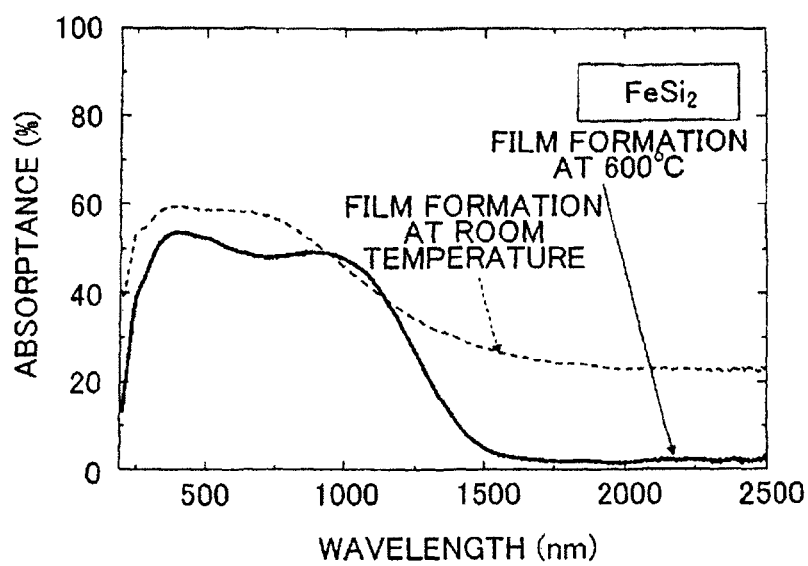
FIG. 3B is a diagram that shows the absorptance spectra of FeSi$_2$ films produced in Example 1 at substrate temperatures of 600° C. and room temperature (24° C.)

The graphs for the absorptance in FIG. 2B and FIG. 3B were determined based on the following relationship from the graphs for the transmittance and reflectance in FIG. 2A and FIG. 3A.

(absorptance (%))=100%−(transmittance (%))−(reflectance (%))

As is clear from FIGS. 2A and 2B and FIGS. 3A and 3B, large differences were not present between the Mo film and FeSi$_2$ film in the transmittance, reflectance, and absorptance when film formation was carried out at room temperature.

In contrast to this, and as is clear from FIGS. 2A and 2B and FIGS. 3A and 3B, when film formation was carried out at 600° C. large differences appeared in the transmittance, reflectance, and absorptance between the Mo film and the FeSi$_2$ film.

Specifically, in the absorptance spectrum for the FeSi$_2$ film formed at 600° C., a high absorptance is seen in wavelengths near the visible light wavelength while the absorptance declines sharply in the wavelength near 1200 nm and a fairly low absorptance is seen in the near infrared region. That is, it is shown that the FeSi$_2$ film formed at 600°

C. efficiently absorbs visible light at wavelengths of several hundred nm and converts it into heat and exhibits little thermal radiation due to thermal emission at temperatures of several hundred ° C.

Figure 4:
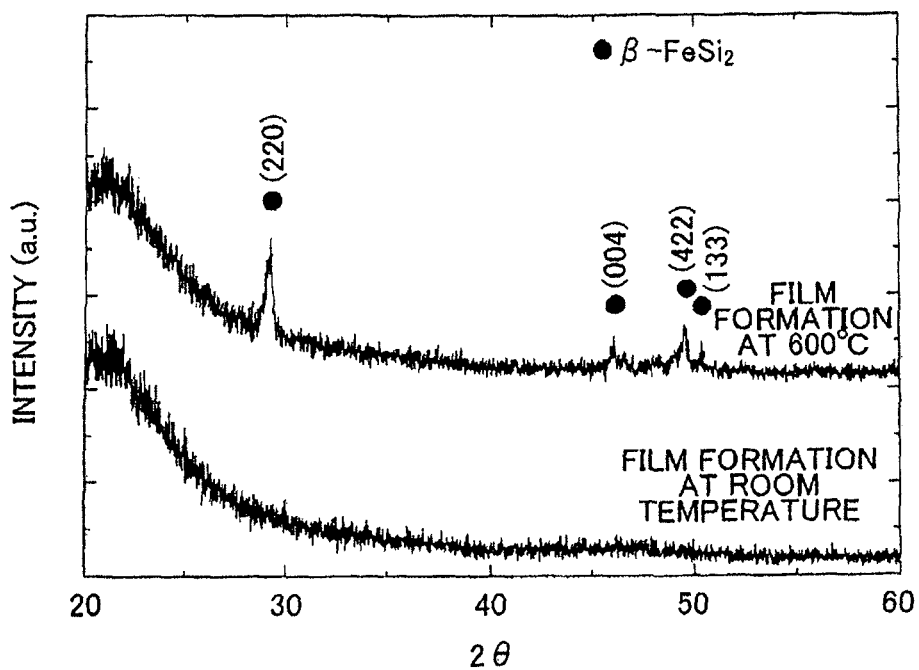
FIG. 4 is a diagram that shows the results of X-ray diffraction analysis of FeSi$_2$ films produced in Example 1 at substrate temperatures of 600° C. and room temperature (24° C.)

The results of the X-ray diffraction analysis (thin film method (θ=1.5°)) of the FeSi$_2$ films formed at 600° C. and room temperature are shown in FIG. 4. As may be understood from this FIG. 4, the film of FeSi$_2$ formed at 600° C. is a film of β-phase FeSi$_2$ and the film of FeSi$_2$ formed at room temperature (24° C.) is a film of amorphous FeSi$_2$.

Accordingly, these results demonstrate that the β-FeSi$_2$ film—and not the amorphous FeSi$_2$ film—has preferred properties in terms of solar-thermal conversion and that a β-FeSi$_2$ film is obtained by sputtering at elevated temperatures.

Example 2

Investigation of the Optical Properties of Stacks Containing β-FeSi$_2$ Layer

The reflectance spectra of the stacks 1-1 to 1-4 indicated below were determined by calculation based on the optical constants of the individual layers.

TABLE 1

| | (outside layer) | | | | (substrate side layer) |
|---|---|---|---|---|---|
| stack 1-1 (comparative example) | Al$_2$O$_3$ (50 nm) | Mo (6 nm) | Al$_2$O$_3$ (50 nm) | Mo (100 nm) | |
| stack 1-2 (comparative example) | SiO$_2$ (50 nm) | Mo (6 nm) | SiO$_2$ (50 nm) | Mo (100 nm) | |
| stack 1-3 (invention) | SiO$_2$ (50 nm) | β-FeSi$_2$ (6 nm) | SiO$_2$ (50 nm) | Mo (100 nm) | |
| stack 1-4 (invention) | SiO$_2$ (50 nm) | β-FeSi$_2$ (6 nm) | SiO$_2$ (50 nm) | β-FeSi$_2$ (27 nm) | Mo (100 nm) |

Figure 5A:
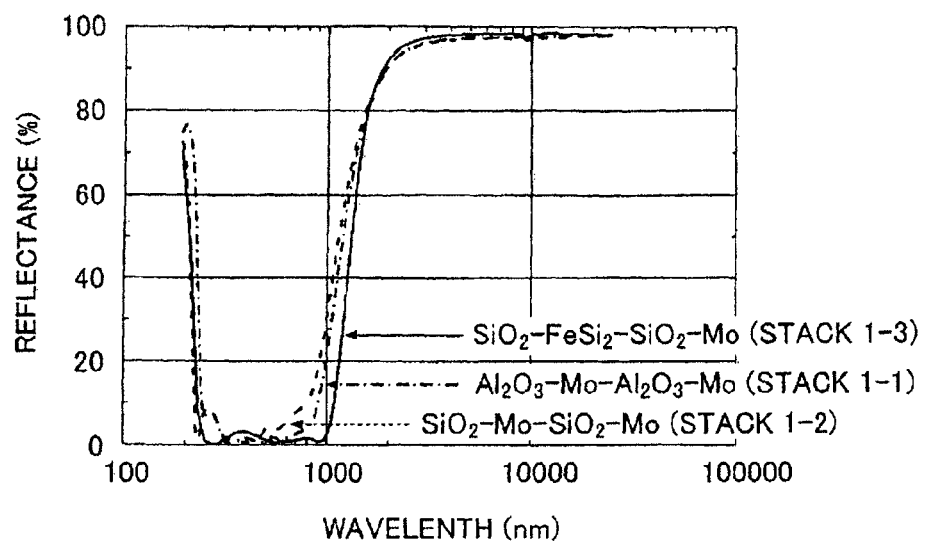
FIG. 5A is a diagram that shows the reflectance spectra of stacks 1-1 to 1-3, obtained by calculation in Example 2.
Figure 5B:
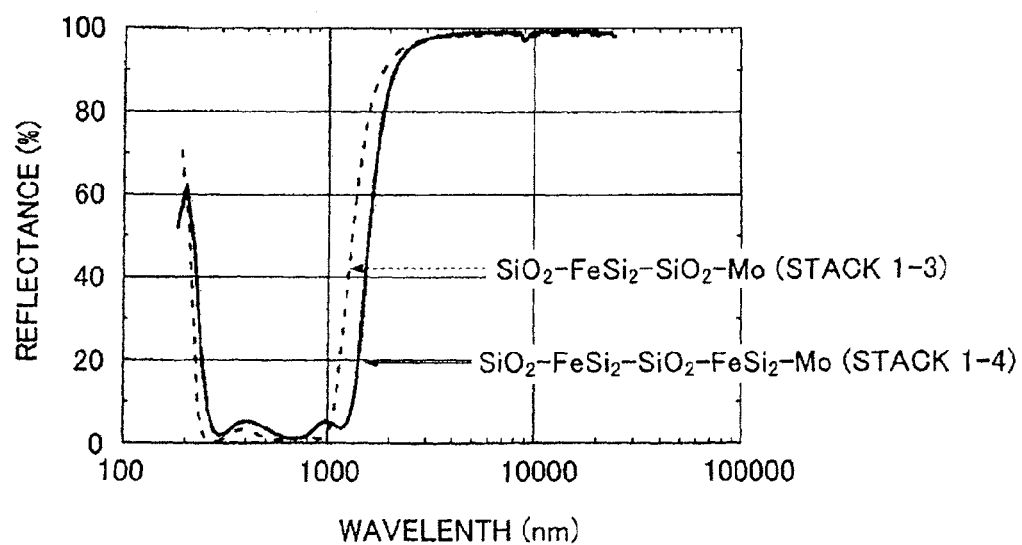
FIG. 5B is a diagram that shows the reflectance spectra of stacks 1-3 and 1-4, obtained by calculation in Example 2.

The calculated reflectance spectra for stacks 1-1 to 1-3 are shown in FIG. 5A. The calculated reflectance spectra for stacks 1-3 and 1-4 are shown in FIG. 5B.

As may be understood from FIG. 5A, in comparison to stacks 1-1 and 1-2 (comparative examples), which use an Mo layer for the light-absorbing layer, stack 1-3 (this embodiment), which uses a β-FeSi$_2$ layer as a light-absorbing layer, has a smaller reflectance in the region of the near infrared to visible light with wavelengths of several hundred nm and undergoes a sharp increase in reflectance at around 1100 nm to reach a larger reflectance in the infrared region at wavelengths of several thousand nm.

Here, for an opaque material, i.e., a material with a transmittance of 0%, because the absorptance and reflectance have the relationship indicated below, in FIGS. 5A and 5B a high reflectance means a low absorptance and a low reflectance means a high absorptance.

absorptance (%)=100%−(reflectance (%))

Accordingly, as may be understood from FIG. 5A, in comparison to stacks 1-1 and 1-2 (comparative examples), which use an Mo layer for the light-absorbing layer, stack 1-3 (this embodiment), which uses a β-FeSi$_2$ layer as a light-absorbing layer, has a larger absorptance in the region of the near infrared to visible light with wavelengths of several hundred nm and undergoes a sharp decline in absorptance at around 1100 nm to reach a smaller absorptance in the infrared region at wavelengths of several thousand nm. Thus, FIGS. 5A and 5B demonstrate that stack 1-3 (this embodiment), which uses a β-FeSi$_2$ layer as a light-absorbing layer, efficiently absorbs visible light and converts it to heat and exhibits little thermal radiation due to thermal emission at temperatures of several hundred ° C.

FIG. 5B gives the reflectance spectra for stack 1-3 (this embodiment), which uses one β-FeSi$_2$ layer as a light-absorbing layer, and stack 1-4 (this embodiment), which uses two β-FeSi$_2$ layers as light-absorbing layers. FIG. 5B demonstrates that the wavelength of the sharp decline in the absorptance can be shifted from the wavelength near 1100 nm to the wavelength near 1500 nm by using two β-FeSi$_2$ layers as absorbing layers. This shifting of the wavelength of the sharp decline in absorptance to the wavelength near 1500 nm can provide a large absorptance in the near infrared region and can thereby further increase the absorptance for sunlight.

Example 3

Problem with Structures in which the β-FeSi$_2$ Film is Directly Stacked on an Mo Film Proceeding as indicated below, a stack was obtained in which an Mo film was directly stacked on the substrate and a β-FeSi$_2$ film was directly stacked on this Mo film. Thus, a stack having the structure shown in FIG. 6 was obtained.

(Stack Production)

Quartz glass (length 30 mm×width 20 mm×thickness 1 mm) was used as the substrate, and the substrate temperature was set at 600° C. The atmosphere during sputtering was an Ar atmosphere (flow rate=20 sccm, pressure=0.4 Pa).

A plasma was generated for an Mo target at a sputtering power of 50 W using a DC power source. The film formation time was 19 minutes, which provided an Mo film thickness of approximately 100 nm.

After this, a plasma was generated for a β-FeSi$_2$ target at a sputtering power of 50 W using a DC power source. The film formation time was 10 minutes, which provided a thickness of approximately 30 nm for the β-FeSi$_2$ film on the Mo film.

(Evaluations)

Figure 6A:
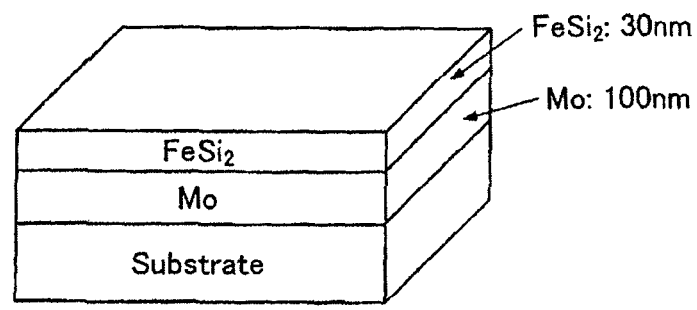
FIG. 6A is a diagram that shows the structure of the stack obtained in Example 3.
Figure 6B:
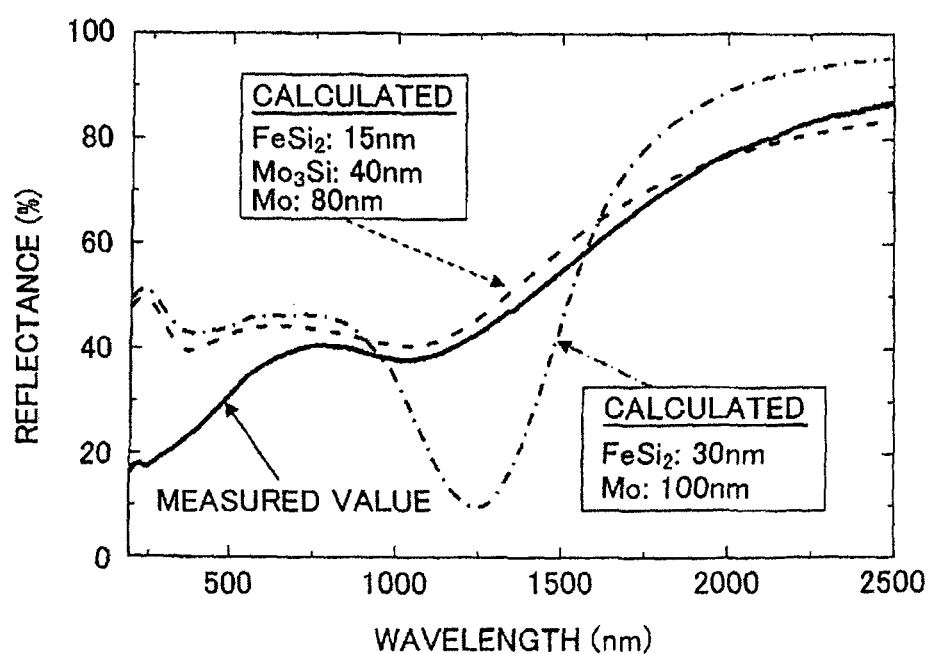
FIG. 6B is a diagram that shows the reflectance spectrum of the stack obtained in Example 3.

The reflectance spectrum was measured on the stack obtained as described above, i.e., the stack having the structure shown in FIG. 6A, and is shown by "measured value" in FIG. 6B.

Along with the measured value of this reflectance spectrum, FIG. 6B also provides the calculated values for the reflectance spectra for a stack for the case in which no reaction occurs between the β-FeSi$_2$ film and the Mo film (β-FeSi$_2$: 30 nm, Mo: 100 nm) and for a stack for the case in which an Mo$_3$Si film is produced by a partial reaction between the β-FeSi$_2$ film and the Mo film (β-FeSi$_2$: 15 nm, Mo$_3$Si: 40 nm, and Mo: 80 nm).

As is demonstrated by FIG. 6B, the measured value of the reflectance spectrum is closer to the reflectance spectrum calculated for the stack for the case in which an Mo$_3$Si film is produced by a partial reaction between the β-FeSi$_2$ film and the Mo film β-FeSi$_2$: 15 nm, Mo$_3$Si: 40 nm, and Mo: 80 nm), than to the reflectance spectrum calculated for the stack for the case in which no reaction occurs between the β-FeSi$_2$ film and the Mo film β-FeSi$_2$: 30 nm, Mo: 100 nm). That is, FIG. 6B demonstrates that an Mo$_3$Si film is produced by a partial reaction between the β-FeSi$_2$ film and the Mo film when a β-FeSi$_2$ film is directly stacked on an Mo film.

Accordingly, these results demonstrate that a barrier film that inhibits the reaction between the Mo film and β-FeSi$_2$ film, for example, an inorganic film such as an SiO₂ layer, is preferably provided between the Mo film and β-FeSi₂ film.

Example 4

Figure 7A:
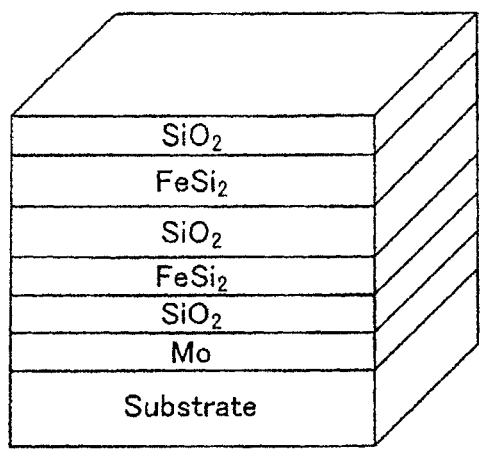
FIG. 7A is a diagram that shows the structure of the stack obtained in Example 4.

Investigation of the Optical Properties of a Stack Having a β-FeSi₂ Film and an Mo Film A stack having the structure shown in FIG. 7A was produced by sputtering and the reflectance spectrum of this film was evaluated. Specifically, a stack having a β-FeSi₂ film and an Mo film was produced and evaluated as described in the following.

(Preparation of the Mo Film and β-FeSi₂ Film)

Quartz glass (length 30 mm×width 20 mm×thickness 1 mm) was used as the substrate, and the substrate temperature was set to 600° C. The atmosphere during sputtering was an Ar atmosphere (flow rate=20 sccm, pressure=0.4 Pa).

Figure 7B:
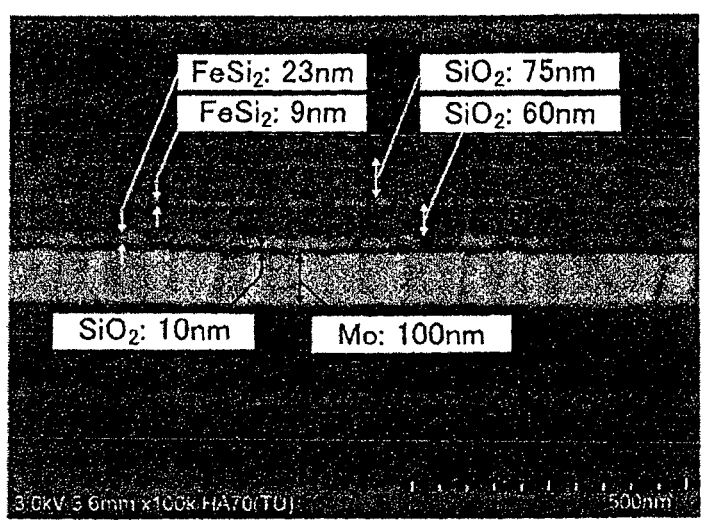
FIG. 7B is a diagram that gives a photograph, taken with a scanning electron microscope (SEM), of the cross section of the stack obtained in Example 4.

When the Mo film was formed, a plasma was generated for an Mo target at a sputtering power of 50 W using a DC power source. When the SiO₂ film was formed, a plasma was generated for an SiO₂ target at a sputtering power of 200 W using a high-frequency current (RF) power source. When the β-FeSi₂ film was formed, a plasma was generated for a β-FeSi₂ target at a sputtering power of 50 W using a DC power source. The film formation time was adjusted to obtain the individual layer thicknesses shown in FIGS. 7A and 7B and Table 2.

TABLE 2

| | (outside layer) | | | | (substrate side layer) | |
|---|---|---|---|---|---|---|
| stack 4 | SiO₂ | FeSi₂ | SiO₂ | FeSi₂ | SiO₂ | Mo |
| (invention) | (75 nm) | (9 nm) | (60 nm) | (23 nm) | (10 nm) | (100 nm) |

The cross-sectional structure of the obtained stack was observed with a SEM, as a result of which it was found that the film thickness of each layer was close to the intended value and that each layer had a flat surface.

(Evaluations)

The reflectance spectrum of the obtained stack was evaluated. The results of this evaluation are shown in FIGS. 8A and 8B along with the solar spectrum and the thermal emission spectrum at 580° C.

Figure 8A:
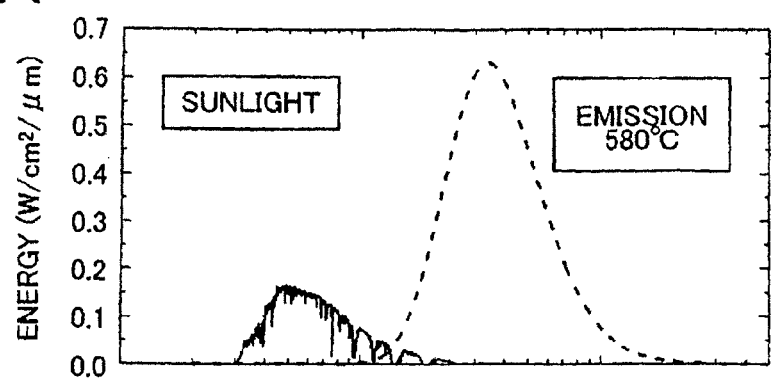
FIG. 8A is a diagram that shows the relationship between the solar spectrum and the thermal emission spectrum at approximately 580° C.
Figure 8B:
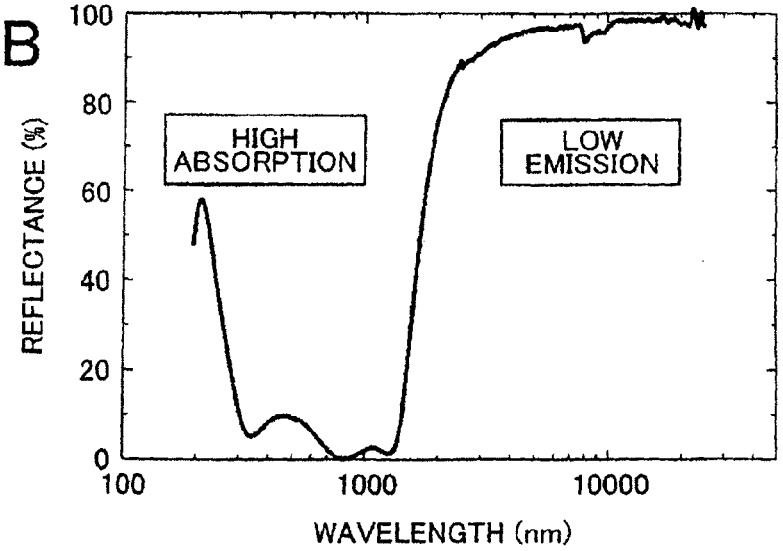
FIG. 8B is a diagram that shows the reflectance spectrum of the stack obtained in Example 4.

As shown in FIGS. 8A and 8B, this stack has a low reflectance, of not more than 10%, in the visible light to near infrared region at wavelengths of 300 to 1400 nm. In addition, the reflectance of this stack rises sharply on the longer wavelength side above 1400 nm and as a consequence this stack has a reflectance of at least 90% at wavelengths of 3000 nm and above. Since the transmittance of the stack is approximately zero in these wavelength ranges, the absorptance is given by the following formula: (absorptance (%))=100%−(reflectance (%)).

Accordingly, FIGS. 8A and 8B demonstrate that this stack has a high absorptance in the visible light to near infrared region and a low absorptance in the long wavelength region that corresponds to the thermal emission at temperatures of several hundred ° C. (for example, 580° C.). A low absorptance in the long wavelength region corresponding to the thermal emission at temperatures of several hundred ° C. means that the emittance at these temperatures is low. That is, FIGS. 8A and 8B demonstrate that this stack efficiently absorbs visible light at wavelengths of several hundred nm and converts it to heat and exhibits little thermal radiation due to thermal emission at temperatures of several hundred ° C.

A value of 89.6% was obtained when the absorptance α indicating the absorption performance for sunlight was determined from the reflectance spectrum in FIGS. 8A and 8B, while a value of 6.62% was obtained when the emittance ∈ (580° C.) indicating the loss performance as emitted heat was determined from the reflectance spectrum in FIGS. 8A and 8B. The photothermal conversion efficiency η at 580° C. calculated from this α and ∈ was 80.0%.

The absorptance α indicating the absorption performance for sunlight, the emittance ∈ (580° C.) indicating the loss performance as emitted heat, and the photothermal conversion efficiency η referenced in connection with this embodiment are described in the following.

(The Absorptance α Indicating the Absorption Performance for Sunlight)

The absorptance α refers to the solar absorptance defined in JIS R 3106 and was determined using the following equation as a weighted average in which the spectral absorptance α(λ) is multiplied by a weighting factor Eλ·λΔ that is based on the solar spectral distribution.

$$\alpha = \frac{\sum_\lambda E\lambda \cdot \Delta\lambda \cdot \alpha(\lambda)}{\sum_\lambda E\lambda \cdot \Delta\lambda}$$

α(λ): spectral absorptance E
λ: standard spectral distribution Eλ·λ of the direct solar radiation relative value
Δ: weighting factor (JIS R 3106)

(The Emittance ∈ (580° C.) Indicating the Loss Performance as Emitted Heat)

The emittance ∈ (580° C.) was calculated using the following equation as a weighted average in which the spectral absorptance α(λ) is multiplied by the emission spectrum $B_{580° C.}(\lambda)$ at 580° C. based on Planck's equation.

$$\varepsilon = \frac{\int_0^\infty \alpha(\lambda) B_{580° C.}(\lambda)}{\int_0^\infty B_{580° C.}(\lambda)}$$

$$B_{580° C.}(\lambda) = \frac{2\pi c^2 h}{\lambda^5 \left[\exp\left(\frac{hc}{\lambda kt}\right) - 1\right]}$$

α(λ): spectral absorptance
c: speed of light
h: Planck's constant
k: Boltzmann's constant
T: absolute temperature (580° C.=853 K)

(The Photothermal Conversion Efficiency η)

The photothermal conversion efficiency η was determined using the following equation, which is defined in the above-document Kennedy, and the absorptance α and emittance ∈ determined as described above.

$$\eta = \alpha - \varepsilon \frac{\sigma T^4}{CI}$$

σ: Stefan-Boltzmann constant
T: absolute temperature

C: degree of light concentration
I: solar intensity (AM1.5)

Example 5

Evaluation of the Optical Properties of a β-FeSi$_2$—SiO$_2$ Composite Film

The following films were formed by sputtering and their transmittance, reflectance, and absorptance spectra were evaluated: a β-FeSi$_2$—SiO$_2$ composite film in which β-FeSi$_2$ was dispersed in an SiO$_2$ matrix (a cersemi film (ceramic+semiconductor=cersemi)) and an Mo—SiO$_2$ composite film in which Mo was dispersed in an SiO$_2$ matrix (a cermet film (ceramic+metal=cermet)). These composite films were produced and evaluated specifically as described below.

(Formation and Evaluation of the β-FeSi$_2$—SiO$_2$ Composite Film)

Quartz glass (length 30 mm×width 20 mm×thickness 1 mm) was used as the substrate, and the substrate temperature was set to 600° C. The atmosphere during sputtering was an Ar atmosphere (flow rate=20 sccm, pressure=0.4 Pa).

A β-FeSi$_2$ target and an SiO$_2$ target were used for the targets. A plasma was generated for the β-FeSi$_2$ target at a sputtering power of 50 W using a DC power source. A plasma was generated for the SiO$_2$ target at a sputtering power of 100 W using a RF power source.

The film formation time was set at 20 minutes, thereby providing a thickness of approximately 100 nm for the β-FeSi$_2$—SiO$_2$ composite film.

According to the results of X-ray photoelectron spectroscopy (XPS), the proportion of the β-FeSi$_2$ in the β-FeSi$_2$—SiO$_2$ composite film was 61 vol %. In addition, the β-FeSi$_2$ nanoparticles in the β-FeSi$_2$—SiO$_2$ composite film had not reacted with the silicon of the SiO$_2$ matrix, nor had they underdone oxidation, and the β-FeSi$_2$ state was thus retained.

Figure 9A:
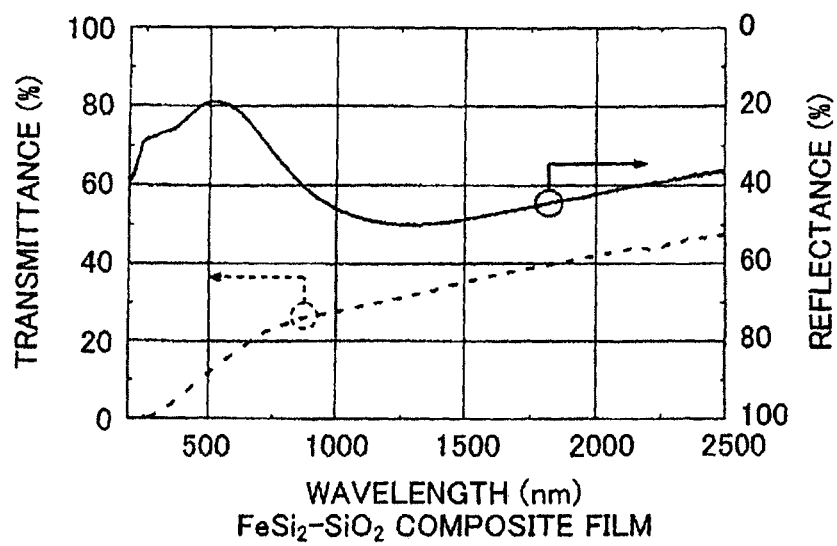
FIG. 9A and FIG. 9B are diagrams that show the transmittance and reflectance spectra for the FeSi$_2$—SiO$_2$ composite film and the Mo—SiO$_2$ composite film obtained in Example 5.
Figure 10:
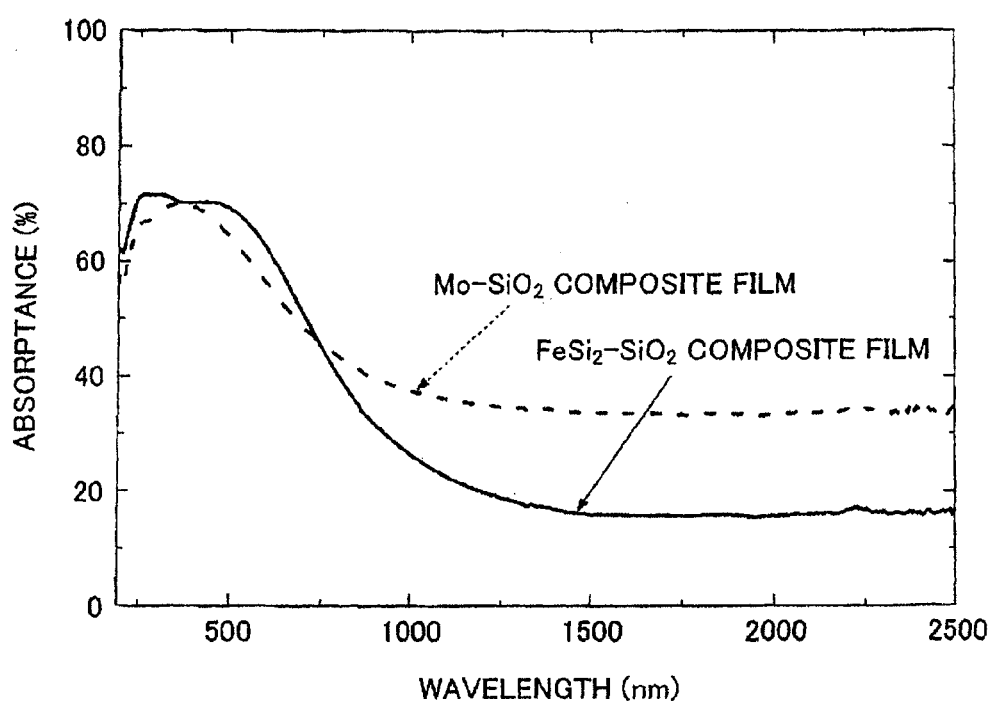
FIG. 10 is a diagram that shows the absorptance spectra of the FeSi$_2$—SiO$_2$ composite film and the Mo—SiO$_2$ composite film obtained in Example 5.

The transmittance and reflectance spectra for the obtained β-FeSi$_2$—SiO$_2$ composite film are given in FIG. 9A. The absorptance spectrum for this composite film is given in FIG. 10. The absorptance spectrum in FIG. 10 is determined based on the following relationship from the transmittance and reflectance spectra in FIG. 9A:

absorptance (%)=100%−(transmittance (%))−(reflectance (%)).

(Formation and Evaluation of the Mo—SiO$_2$ Composite Film)

Quartz glass (length 30 mm×width 20 mm×thickness 1 mm) was used as the substrate, and the substrate temperature was set to 600° C. The atmosphere during sputtering was an Ar atmosphere (flow rate=20 sccm, pressure=0.4 Pa).

An Mo target and an SiO$_2$ target were used for the targets. A plasma was generated for the Mo target at a sputtering power of 20 W using a DC power source. A plasma was generated for the SiO$_2$ target at a sputtering power of 200 W using a RF power source.

The film formation time was set at 18 minutes, thereby providing a thickness of approximately 80 nm for the Mo—SiO$_2$ composite film.

According to the results of XPS, the proportion of the Mo in the Mo—SiO$_2$ composite film was 54 vol %. In addition, the Mo nanoparticles in the Mo—SiO$_2$ composite film had reacted with the silicon of the SiO$_2$ matrix during the film formation process, resulting in a partial silicidation.

Figure 9B:
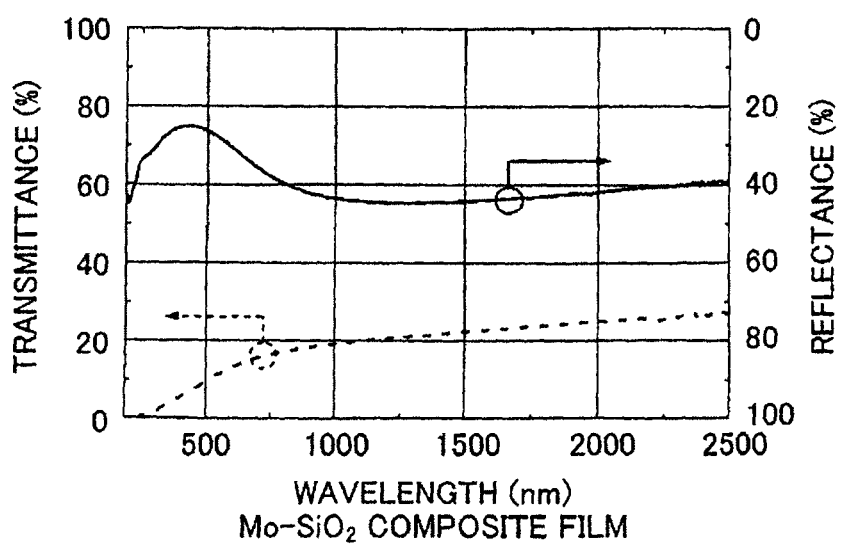

The transmittance and reflectance spectra for the obtained Mo—SiO$_2$ composite film are given in FIG. 9B. The absorptance spectrum for this composite film is given in FIG. 10. The absorptance spectrum in FIG. 10 is determined based on the following relationship from the transmittance and reflectance spectra in FIG. 9B:

absorptance (%)=100%−(transmittance (%))−(reflectance (%)).

(Analysis of the Results of the Evaluations)

It may be understood from the absorptance spectra shown in FIG. 10 that, in comparison to the Mo—SiO$_2$ composite film, the β-FeSi$_2$—SiO$_2$ composite film has a higher absorptance in wavelengths near the visible light wavelength and undergoes a sharper change in absorptance in the near infrared region. Moreover, the β-FeSi$_2$—SiO$_2$ composite film is shown to have a lower absorptance in the long wavelength region than the Mo—SiO$_2$ composite film, notwithstanding the somewhat larger film thickness of the former. This means that, relative to the Mo—SiO$_2$ composite film, the β-FeSi$_2$—SiO$_2$ composite film absorbs visible light and converts it to heat more efficiently and exhibits less thermal radiation due to thermal emission at temperatures of several hundred ° C.

The proportion of the β-FeSi$_2$ in the β-FeSi$_2$—SiO$_2$ composite film can be adjusted using the power supplied to the β-FeSi$_2$ target and the SiO$_2$ target. For example, by supplying RF power of 200 W to the SiO$_2$ target while using 10 W, 30 W, or 50 W for the DC power supplied to the β-FeSi$_2$ target, the proportion of the β-FeSi$_2$ in the β-FeSi$_2$—SiO$_2$ composite film could be adjusted to 8 vol %, 31 vol %, and 46 vol %, Example 6

Figure 11A:
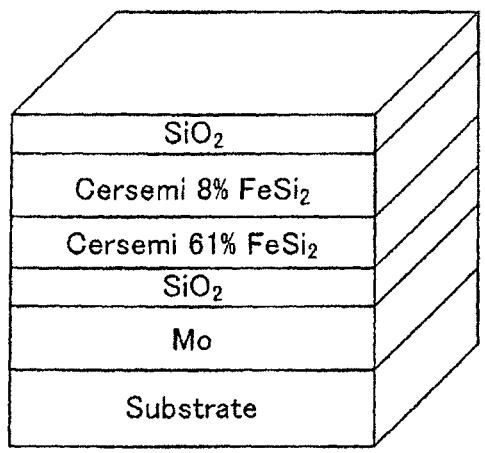
FIG. 11A is a diagram that shows the structure of the stack obtained in Example 6.
Figure 11B:
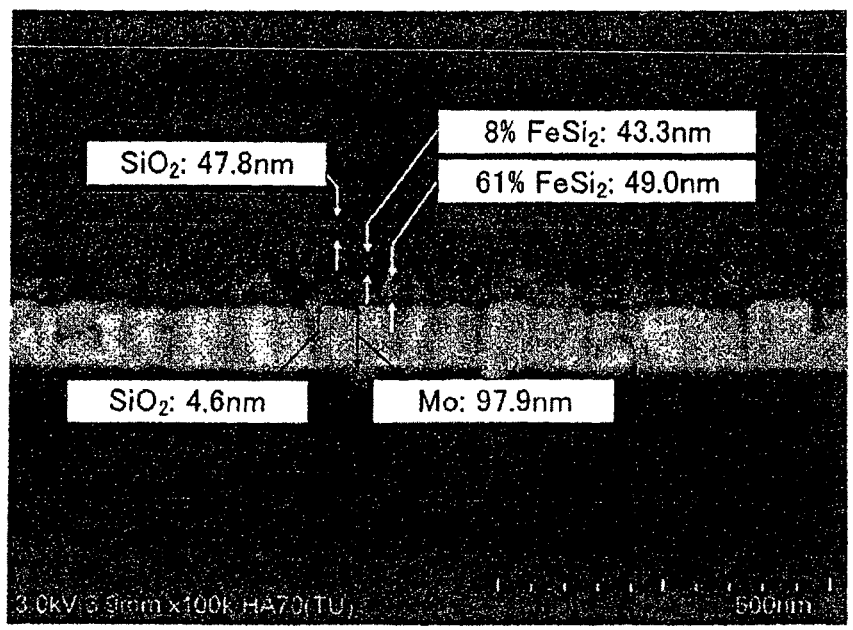
FIG. 11B is a diagram that gives a photograph, taken with a SEM, of the cross section of the stack obtained in Example 6.

Investigation of the Optical Properties of a Stack Having a β-FeSi$_2$—SiO$_2$ Composite Film (1) The stack shown in FIGS. 11A and 11B was prepared by film formation by sputtering and the absorptance spectrum of this film was evaluated. The stack was prepared and evaluated specifically as described below.

(Stack Formation)

Quartz glass (length 30 mm×width 20 mm×thickness 1 mm) was used as the substrate, and the substrate temperature was set to 600° C. The atmosphere during sputtering was an Ar atmosphere (flow rate=20 sccm, pressure=0.4 Pa).

When Mo film was formed, a plasma was generated for an Mo target at a sputtering power of 50 W using a DC power source. The film formation time was set at 20 minutes, thereby providing a film thickness for the Mo film of approximately 100 nm.

A β-FeSi$_2$ target and an SiO$_2$ target were used for the β-FeSi$_2$—SiO$_2$ composite film (β-FeSi$_2$: 61 vol %) on the substrate side. A plasma was generated for the β-FeSi$_2$ target at a sputtering power of 50 W using a DC power source. A plasma was generated for the SiO$_2$ target at a sputtering power of 100 W using a RF power source. The film formation time was set at 11 minutes, thereby providing a thickness of approximately 50 nm for the β-FeSi$_2$—SiO$_2$ composite film.

The proportion of the β-FeSi$_2$ in the β-FeSi$_2$—SiO$_2$ composite film was 61 vol %.

A β-FeSi$_2$ target and an SiO$_2$ target were used for the outer side β-FeSi$_2$—SiO$_2$ composite film (β-FeSi$_2$: 8 vol %). A plasma was generated for the β-FeSi$_2$ target at a sputtering power of 10 W using a DC power source. A plasma was generated for the SiO$_2$ target at a sputtering power of 200 W using a RF power source. The film formation time was set at 19 minutes, thereby providing a thickness of approximately 45 nm for the β-FeSi$_2$—SiO$_2$ composite film.

The proportion of the β-FeSi$_2$ in the β-FeSi$_2$—SiO$_2$ composite film was 8 vol %.

An SiO$_2$ target was used to form the surface most SiO$_2$ film. A plasma was generated for the SiO$_2$ target at a sputtering power of 200 W using a RF power source. The film formation time was set at 55 minutes, thereby providing a thickness of approximately 45 nm for the SiO$_2$ film.

The cross-sectional structure of the obtained stack was examined with a SEM, as a result of which it was found, as shown in FIG. 11B, that the film thicknesses of the individual layers were close to the intended values and that each layer had a flat surface.

(Evaluation)

The reflectance spectrum of the obtained stack was evaluated. The results of this evaluation are shown in FIGS. 12A and 12B.

As shown in FIG. 12B, this stack has a low reflectance, of not more than approximately 10%, in the visible light to near infrared region at wavelengths up to 1300 nm. In addition, this stack presents a sharp rise in reflectance at wavelengths longer than this and has a reflectance of at least 90% at wavelengths of 3000 nm and above.

According to the reflectance spectrum shown in FIG. 12B, the absorptance α indicating the absorption performance for sunlight was 91.5%, the emittance ∈ (580° C.) indicating the loss performance as emitted heat was 7.26%, and the photothermal conversion efficiency η at 580° C. was 80.6%. This photothermal conversion efficiency η was larger than the value for the stack in Example 4.

Example 7

Figure 13A:
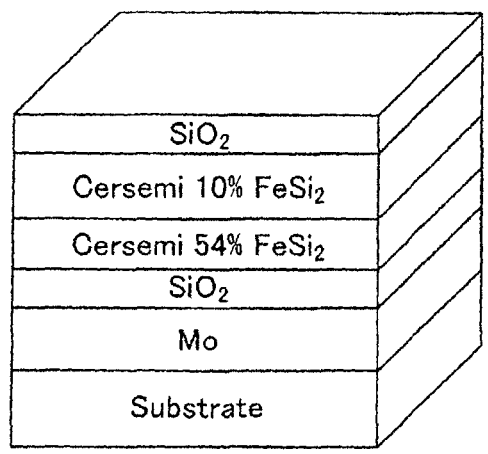
FIG. 13A is a diagram that shows the structure of the stack obtained in Example 7.
Figure 13B:
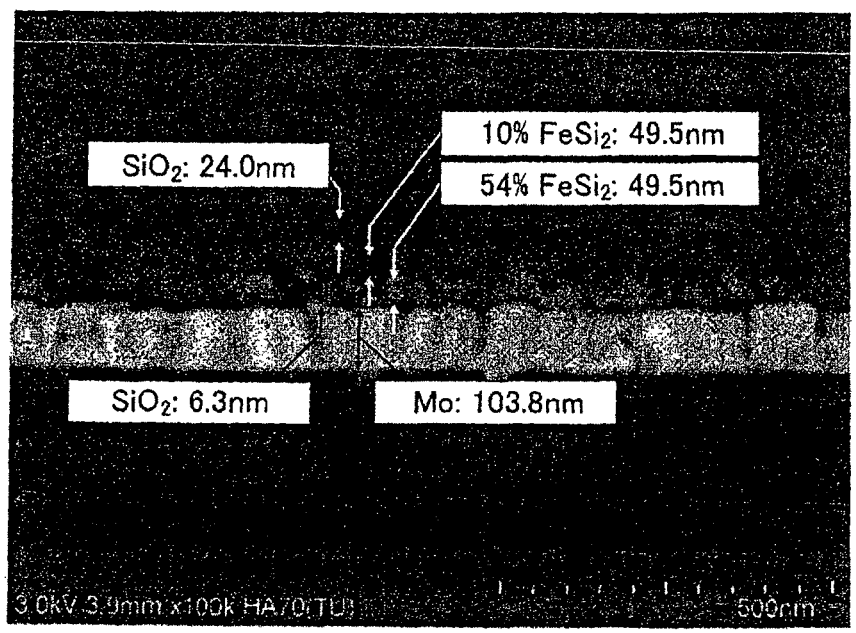
FIG. 13B is a diagram that gives a photograph, taken with a SEM, of the cross section of the stack obtained in Example 7.

Investigation of the Optical Properties of a Stack Having a β-FeSi$_2$—SiO$_2$ Composite Film (2) The stack shown in FIGS. 13A and 13B was prepared by film formation by sputtering and the light absorptance spectrum of this film was evaluated. The stack was prepared and evaluated specifically as described below.

(Stack Formation)

Quartz glass (length 30 mm×width 20 mm×thickness 1 mm) was used as the substrate, and the substrate temperature was set to 600° C. The atmosphere during sputtering was an Ar atmosphere (flow rate=20 sccm, pressure=0.4 Pa).

When the Mo film was formed, a plasma was generated for an Mo target at a sputtering power of 50 W using a DC power source. The film formation time was set at 20 minutes, thereby providing a film thickness for the Mo film of approximately 100 nm.

A β-FeSi$_2$ target and an SiO$_2$ target were used for the β-FeSi$_2$—SiO$_2$ composite film (β-FeSi$_2$: 54 vol %) on the substrate side. A plasma was generated for the β-FeSi$_2$ target at a sputtering power of 50 W using a DC power source. A plasma was generated for the SiO$_2$ target at a sputtering power of 90 W using a RF power source. The film formation time was set at 12 minutes, thereby providing a thickness of approximately 55 nm for the β-FeSi$_2$—SiO$_2$ composite film.

The proportion of the β-FeSi$_2$ in the β-FeSi$_2$—SiO$_2$ composite film was 54 vol %.

A β-FeSi$_2$ target and an SiO$_2$ target were used for the outer side β-FeSi$_2$—SiO$_2$ composite film (β-FeSi$_2$: 10 vol %). A plasma was generated for the β-FeSi$_2$ target at a sputtering power of 10 W using a DC power source. A plasma was generated for the SiO$_2$ target at a sputtering power of 200 W using a RF power source. The film formation time was set at 21 minutes, thereby providing a thickness of approximately 55 nm for the β-FeSi$_2$—SiO$_2$ composite film.

The proportion of the β-FeSi$_2$ in the β-FeSi$_2$—SiO$_2$ composite film was 10 vol %.

An SiO$_2$ target was used to form the surfacemost SiO$_2$ film. A plasma was generated for the SiO$_2$ target at a sputtering power of 200 W using a RF power source. The film formation time was set at 15 minutes, thereby providing a thickness of approximately 12 nm for the SiO$_2$ film.

The thickness of the SiO$_2$ target in this example was different from that in Example 6, which resulted in a higher SiO$_2$ film formation rate in this example.

The obtained stack was subjected to a heat treatment for 1 hour at 750° C. in a vacuum (pressure not more than 5 Pa).

The cross-sectional structure of the obtained stack before and after the heat treatment was examined with a SEM, as a result of which, as shown in FIG. 13B, each layer was confirmed to have a flat surface. However, the thickness of both the substrate side and outer side β-FeSi$_2$—SiO$_2$ composite films was reduced from approximately 55 nm to approximately 50 nm by the heat treatment. In addition, the β-FeSi$_2$ particles in the β-FeSi$_2$—SiO$_2$ composite film underwent crystal growth and the particle size was enlarged as a result. The reduction in the thickness of the β-FeSi$_2$—SiO$_2$ composite film is thought to be associated with the crystal growth of the β-FeSi$_2$ particles. The thickness of the surfacemost SiO$_2$ film underwent a slight increase.

(Evaluation)

Figure 14A:
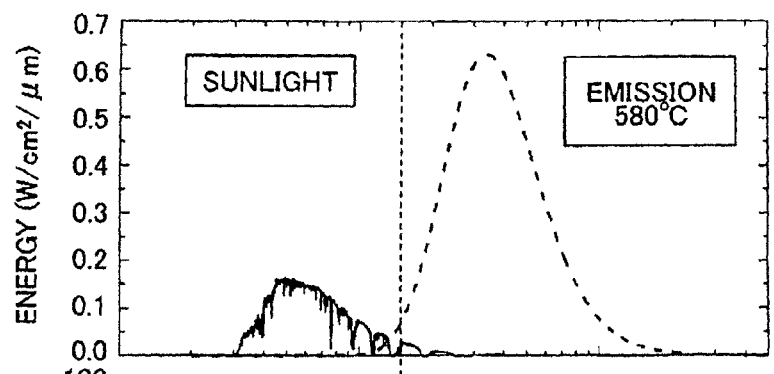
FIG. 14A is a diagram that shows the relationship between the solar spectrum and the thermal emission spectrum at approximately 580° C.

The reflectance spectrum of the stack was evaluated before and after the heat treatment. The results of this evaluation are shown in FIGS. 14A and 14B.

Figure 14B:
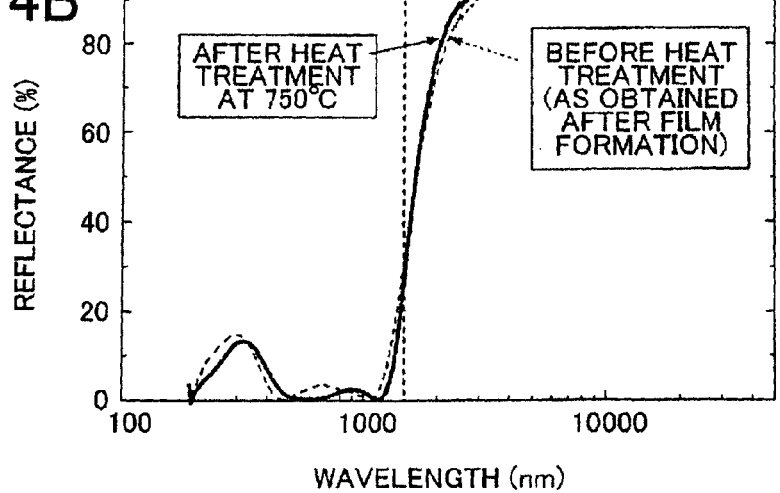
FIG. 14B is a diagram that shows the reflectance spectrum of the stack obtained in Example 7.

As shown in FIG. 14B, the increase in the reflectance at a wavelength of approximately 1300 nm with this stack was made even sharper by the heat treatment.

According to the reflectance spectrum shown in FIG. 14B, the absorptance α indicating the absorption performance for sunlight was 90.6% before the heat treatment and 91.2% after the heat treatment. The emittance ∈ (580° C.) indicating the loss performance as emitted heat was 7.38% before the heat treatment and 6.46% after the heat treatment. The photothermal conversion efficiency η was 79.7% before the heat treatment and 81.7% after the heat treatment. The photothermal conversion efficiency η was thus improved by the heat treatment.

Figure 15:
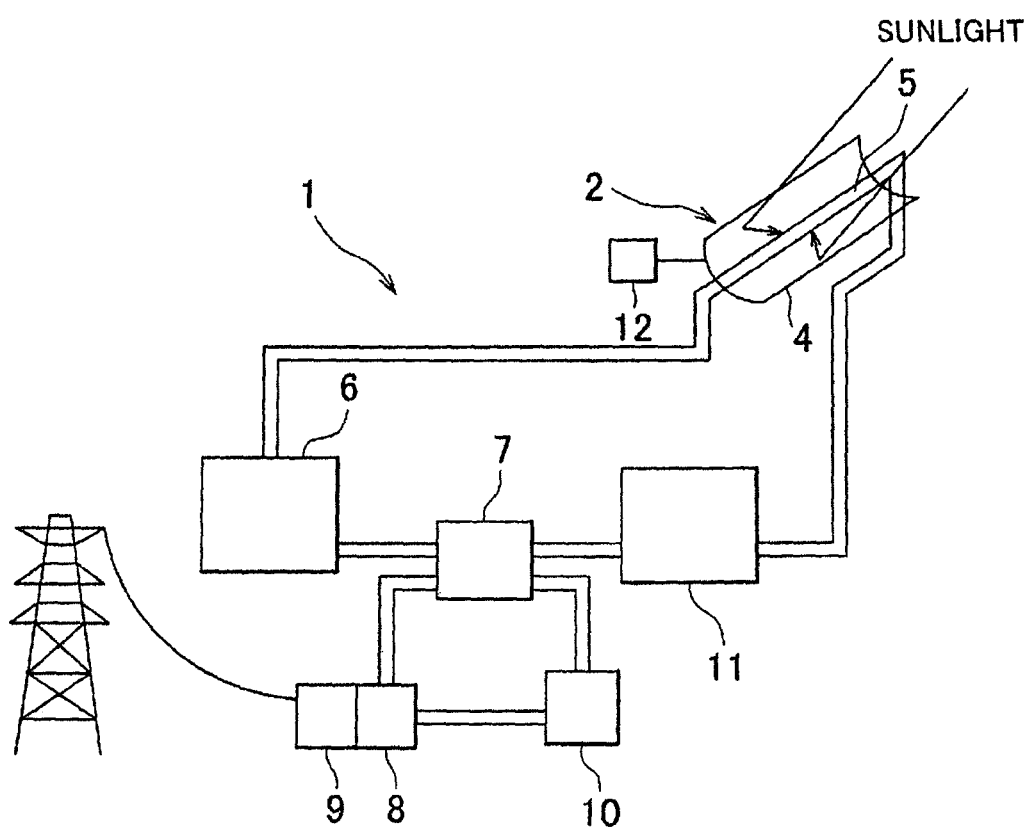
FIG. 15 is a schematic diagram of a solar thermal power generation device.
Figure 16:
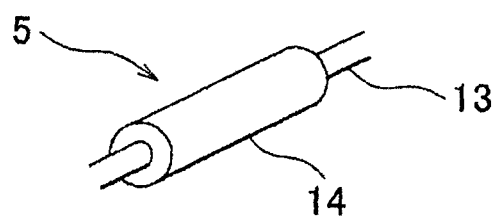
FIG. 16 is a schematic diagram of the thermal medium circulation path between the collector and the electric power generator.

A schematic diagram of a trough type solar thermal power generation device 1 is shown in FIG. 15. A collector 2 includes a mirror 4 and a heat collection pipe 5. The first thermal medium (molten salt) in the heat collection pipe 5 is heated by sunlight collected by the mirror. The heated first thermal medium is transferred to a heat storage tank 6. Then, the first thermal medium is transferred to a heat exchanger 7 and is heat-exchanged with water that is the second thermal medium. Thereby, the water is converted into a vapor. The vapor is transferred to a turbine 8 and electricity is generated by an electrical power generator 9. The generated electricity is transferred to a power grid. Then, the vapor is turned to water by a condenser 10 and is transferred to the heat exchanger 7. The first thermal medium cooled by the heat exchanger 7 is stored in a tank 11. Then, the cooled first thermal medium is transferred to the heat collection pipe 5. A control device 12 automatically controls the direction and angle of the mirrors 4 in order to efficiently concentrate sunlight at the heat collection pipe 5. FIG. 16 illustrates the schematic diagram of the heat collection pipe 5. The heat collection pipe 5 includes a flow channel 13 through which the first thermal medium flows and a container 14 which covers the flow channel 13. At least one of the flow channel 13 and the container 14 is coated by the solar-thermal conversion stack.

The invention claimed is:

1. A solar-thermal conversion device comprising:
    a first layer consisting of a solar-thermal conversion member comprising a β-FeSi$_2$ phase material;
    a collector;
    a thermal medium; and
    at least one of a container and a flow channel for the thermal medium,
    wherein the first layer is disposed on a surface of at least one of the container and the flow channel;
    the thermal medium is held within at least one of the container and the flow channel;
    light is concentrated on at least one of the container and the flow channel; and
    the thermal medium within at least one of the container and the flow channel is heated by the concentrated light.

2. The solar-thermal conversion device according to claim 1, wherein a proportion of the β-FeSi$_2$ phase material in the solar-thermal conversion member is at least 95 vol %.

3. The solar-thermal conversion device according to claim 1, wherein
    particles made of the β-FeSi$_2$ phase material are dispersed in a matrix of an inorganic material.

4. The solar-thermal conversion device according to claim 3, wherein the β-FeSi$_2$ phase material is at least 80% volume with respect to the solar-thermal conversion member.

5. The solar-thermal conversion device according to claim 1, wherein the solar-thermal conversion member is a film.

6. The solar-thermal conversion device according to claim 5, wherein a thickness of the film is from 1 nm to 10 μm.

7. The solar-thermal conversion device according to claim 1, comprising a solar-thermal conversion stack comprising:
    the first layer; and
    a second layer consisting of an inorganic material,
    wherein the first layer and the second layer are stacked.

8. The solar-thermal conversion device according to claim 7, wherein the second layer includes a ceramic layer consisting of an oxide, a nitride, a carbide, an oxynitride, an oxycarbide, or an oxycarbonitride.

9. The solar-thermal conversion device according to claim 8, wherein an outermost layer of the solar-thermal conversion stack is the ceramic layer.

10. The solar-thermal conversion device according to claim 8, wherein
    the second layer further includes a metal layer, and
    the ceramic layer is disposed between the metal layer and the first layer.

11. The solar-thermal conversion device according to claim 10, wherein the metal layer is stacked directly on a substrate or is stacked on a substrate with another layer interposed therebetween.

12. The solar-thermal conversion device according to claim 10, wherein
    the metal layer is a molybdenum layer, and
    the ceramic layer is an SiO$_2$ layer.

13. The solar-thermal conversion device according to claim 8, wherein
    the second layer further includes a metal layer,
    the ceramic layer includes a first ceramic layer and a second ceramic layer; and
    the first ceramic layer is disposed between the metal layer and the first layer, and the first layer is disposed between the first ceramic layer and the second ceramic layer.

14. The solar-thermal conversion device according to claim 13, wherein the metal layer is stacked directly on a substrate or is stacked on a substrate with another layer interposed therebetween.

15. The solar-thermal conversion device according to claim 13, wherein
    the metal layer is a molybdenum layer, and
    the ceramic layer is an SiO$_2$ layer.

16. The solar-thermal conversion device according to claim 1, wherein the thermal medium is heated to a temperature of 300° C. to 900° C.

17. The solar-thermal conversion device according to claim 1, wherein the solar-thermal conversion device has a shape of a parabolic dish, a solar tower, a parabolic trough, a Fresnel, or a linear Fresnel.

18. A solar thermal power generation device comprising:
    the solar-thermal conversion device according to claim 1; and
    an electrical power generator,
    wherein the thermal medium in at least one of the container and the flow channel is heated by the solar-thermal conversion device, and electric power is generated by the electrical power generator using a thermal energy of the heated thermal medium.

19. A method of producing the solar-thermal conversion device according to claim 1, comprising:
    obtaining the β-FeSi$_2$ phase material by physical vapor deposition at a substrate temperature of at least 300° C.

20. A method of producing the solar-thermal conversion device according to claim 1, comprising:
    heating an FeSi$_2$ phase material to a temperature of at least 300° C. and converting the FeSi$_2$ phase material to the β-FeSi$_2$ phase material.

21. The solar-thermal conversion device according to claim 1, further comprising:
    a solar-thermal conversion stack comprising the first layer.

22. The solar-thermal conversion device according to claim 21, wherein the thermal medium is heated to a temperature of 300° C. to 900° C.

23. The solar-thermal conversion device according to claim 21, wherein the solar-thermal conversion device has a shape of a parabolic dish, a solar tower, a parabolic trough, a Fresnel, or a linear Fresnel.

* * * * *